United States Patent [19]

Haley

[11] Patent Number: 5,290,735
[45] Date of Patent: Mar. 1, 1994

[54] THIN, HIGH LEADCOUNT PACKAGE

[75] Inventor: Kevin J. Haley, San Jose, Calif.

[73] Assignee: Intel Corporation, Santa Clara, Calif.

[21] Appl. No.: 11,944

[22] Filed: Feb. 1, 1993

Related U.S. Application Data

[62] Division of Ser. No. 972,754, Nov. 6, 1992.

[51] Int. Cl.⁵ .......................................... H01L 21/60
[52] U.S. Cl. .................................. 437/217; 437/209; 437/211; 437/214; 437/220
[58] Field of Search ............... 437/209, 217, 211, 220, 437/214, 219

[56] References Cited

U.S. PATENT DOCUMENTS 4,835,120  5/1989  Mallik et al. .................. 437/209
4,837,184  6/1989  Lin et al. ...................... 437/217

*Primary Examiner*—Tom Thomas
*Assistant Examiner*—Kevin M. Picardat
*Attorney, Agent, or Firm*—Blakely Sokoloff Taylor & Zafman

[57] ABSTRACT

A high leadcount surface mount IC package. The IC package of the present invention includes a plastic molded compound which is localized over the surface of the die, such that it covers the interconnections of the die. The package includes a leadframe having many leads. The leads are supported using a ring support structure.

23 Claims, 1 Drawing Sheet

FIG_1
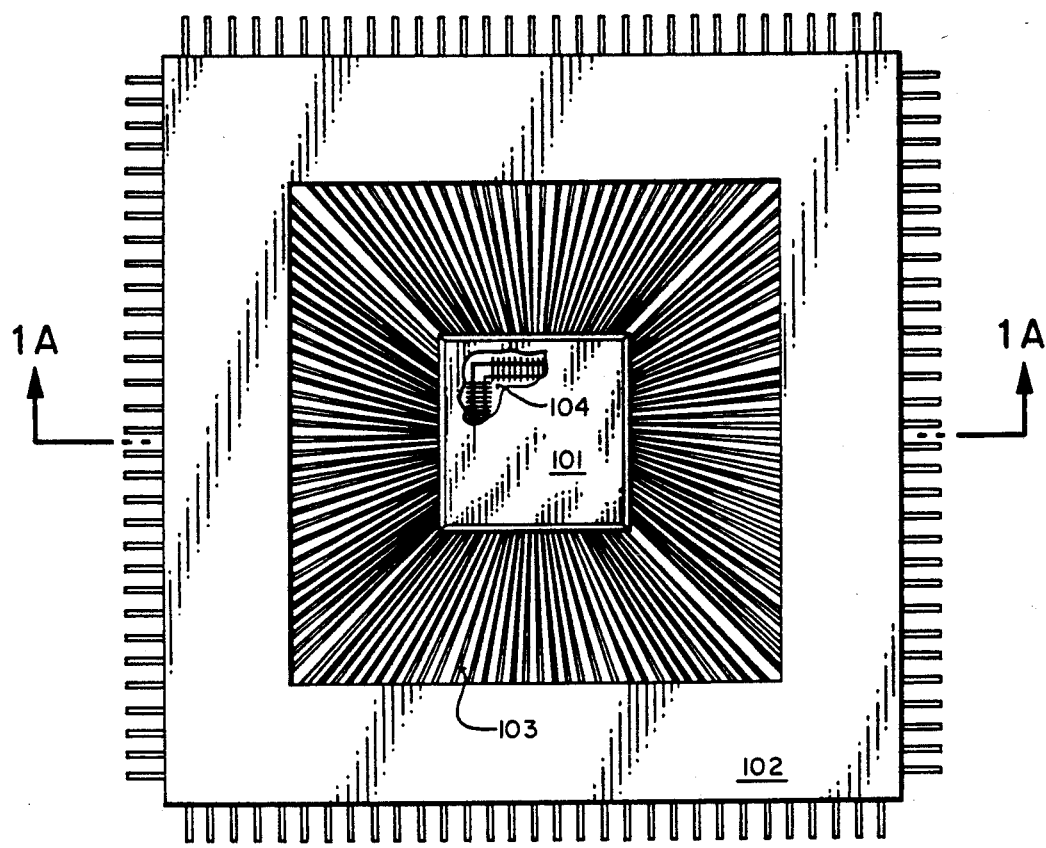
FIG_1A
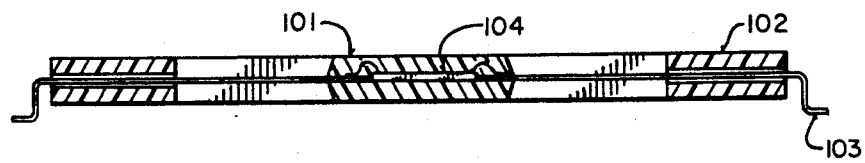

ic circuits.

THIN, HIGH LEADCOUNT PACKAGE

This is a divisional of application Ser. No. 07/972,754, filed Nov. 6, 1992.

FIELD OF THE INVENTION

The present invention relates to the field of integrated circuits; more particularly, the present invention relates to a package for a thin, high lead count surface mount integrated circuit.

BACKGROUND OF THE INVENTION

Packaging of electronic devices provides mechanical support, protection of the electronic circuitry components, and a medium for interconnecting the chip to a circuit board for use in a system. As systems become smaller, a need exists to make packages as small as possible.

The packaging process begins with the fabrication of a crystalline semiconductor material, usually silicon or gallium arsenide. Individual dies (i.e., chips) are formed on the wafer at the same time. Then the wafer is separated into single dies. One limit in making small packages is the size of the dies (e.g., the size of the silicon).

Each of the individual dies is typically packaged in a chip carrier. External connections on the chip carrier package allow for the chip to be mounted on a printed wiring board. The chip carrier is electrically connected to the printed wiring board by surface mounting the chip carrier directly to the mounting surface.

There are a variety of sizes for packages. For instance, thickness of the individual packages varies between different packages. For example, while some packages are only 1 mm think, other packages range up to 5 mm thick. Generally, for packages having leads, the smaller the number of leads that a package has, the thinner the package is itself. The disparity in package thicknesses is due to the use of more molding compound for packages having a greater number of leads. The added molding is required to hold the many leads rigid. Thinner packages do not have some of the reliability problems of larger packages.

The primary problem with larger packages is their susceptibility to cracking during the solder reflow process. The cracking results from moisture which has been absorbed by the plastic. During the solder reflow process, the package heats up to 240°-260° F., causing the absorbed water to turn to steam. The steam causes pressure to build up within the plastic, and the plastic cracks in order to relieve the pressure (i.e., the steam).

To prevent the cracking of the package, the package is protected from moisture. One method of protecting the package from the effects of moisture is to bake the packages at lower temperatures. By baking the package at a lower temperature, the moisture has an opportunity to be released by the plastic molding. This baking step is referred to as the preheat stage. Since the moisture is not trapped in the package, cracking is less likely. Also to prevent the further infiltration of moisture into the package, the chips are stored in moisture proof bags. The bags contain desiccant to keep the humidity within the bag to a minimum while the chips are being stored. The desiccant absorbs excess moisture. However, if the bag has been punctured or has been stored for too long a period of time, then the bag is likely to have absorbed moisture. Whether moisture has entered the storage bag is indicated by a color change in moisture sensitive material which is also included in the bag. Even with these precautions, the packages are baked gently upon removal from the bag before they are mounted on the board to insure against moisture and its effects. The performance of these procedures does not ensure that the packages are moisture free. Thus, even though these precautions are undertaken, damaged chips still may be produced.

When packages are thin, they are less likely to crack. Thin packages are less likely to crack because the packages are too thin to hold or contain a substantial amount of moisture and the preheat stage is enough to drive all of the moisture out of the package. Therefore, at the high temperature of the reflow stage, cracking does not occur because there is an insignificant amount of moisture remaining in the plastic molding.

Another problem associated with larger packages is that larger residual stresses are generated. In other words, large amounts of molding compound induce stresses in the die which the structure cannot support. The residual stresses occur in any molding operation and are accentuated by a mismatch of the thermal expansion between the leadframe, which is generally copper, the molding compound, and the silicon, all of which produce stresses and warpage. As a result, the package warps, resembling a "potato chip". Thus, it is desirable to make the package thin and small (in the x,y dimension) to decrease the die stresses.

As will be shown, the present invention comprises a thin small integrated circuit package. The package of the present invention comprises a thin molding compound locally around the die with a separate support for the leadframe to keep the leads in position.

SUMMARY OF THE INVENTION

A high leadcount surface mount integrated circuit (IC) package is described. The IC package of the present invention includes a plastic encapsulating molded compound. The molded compound is localized over the die and its associated electrical interconnects. The IC package of the present invention also includes a leadframe having multiple leads. The leadframe of the present invention is substantially planar. Each of the leads extends into the molded compound and is electrically coupled to the die by wirebond, tab or other technology. The IC package of the present invention also includes a support structure which supports the leads. In the currently preferred embodiment, the support structure supports the leads in the same plane.

BRIEF DESCRIPTION OF THE DRAWINGS

The present invention will be understood more fully from the detailed description given below and from the accompanying drawings of the preferred embodiment of the invention, which, however, should not be taken to limit the invention to the specific embodiments, but are for explanation and understanding only.

FIG. 1 illustrates the top view of the package of the present invention.

FIG. 1A illustrates a section view of the package containing an integrated circuit according to the present invention.

DETAILED DESCRIPTION OF THE INVENTION

A thin, high leadcount integrated (IC) circuit package is described. In the following description, numerous specific details are set forth, such as specific numbers of leads, materials, shapes, etc., in order to provide a thorough understanding of the preferred embodiment of the present invention. It will be obvious to those skilled in the art that the present invention may be practiced without these specific details. In other instances, well-known techniques have not been described in detail in order not to unnecessarily obscure the present invention.

FIGS. 1 and 1A illustrate the IC package of the present invention. Referring to FIG. 1, die 104 is shown encapsulated by molding compound 101. Die 104 is attached to leadframe 103. In the currently preferred embodiment, die 104 is physically mounted to leadframe 103. Leadframe 103 comprises a plurality of leads. The leads of leadframe 103 are supported by support structure 102. FIG. 1A shows the side view of the IC package of FIG. 1 along section arrow lines 1A.

Molding compound 101 is localized around the die in an area only slightly larger than die 104. Molding compound 101 only extends to an area which covers and protects the bond wire or tab interconnect. In some embodiments, molding compound 101 extends not more than 10% past the side of die 104, while in other embodiments, molding compound 101 extends 2 mm past the end of die 104. In the currently preferred embodiment, molding compound comprises of plastic.

By having molding compound 101 localized and thinly deposited over the top of die 104, the stresses on die 104 are reduced. Essentially, because molding compound 101 itself is reduced in size, the stresses on die 104 are balanced. The silicon is much more rigid than the plastic, such that when the plastic molding compound 101 becomes very thin, the silicon is able to contribute a larger influence or force on the plastic. Since plastic molding compound 101 is thin, it does not exert too much force on the silicon. As a result, the silicon keeps everything flat, so that die 104 stresses are not large enough to cause warpage.

The thinness of the package of the present invention also permits moisture to exit the plastic molding compound more quickly and thoroughly than with thicker packages. A very thin layer of molding compound 101 over die 104 helps the package to be resistant to cracking during solder reflow. Molding compound 101 is able to dry out very quickly during the pre-heat stage of the process. Therefore, there is less tendency for absorbed moisture, as is the case with thicker packages, to crack the package due to steam buildup.

Leadframe 103 is constructed from a number of various metals which are well-known in the art for constructing leads. Leadframe 103 for the present invention is flat and is formed by stamping or etching it from a desired metal sheet. With molding compound 101 limited to slightly greater than the size of die 104, the remainder of the package must be supported. The leads of the package go out to support structure 102. Support structure 102 becomes a permanent part of leadframe 103, serving to support the leads through the package assembly, test and board assembly. Specifically, the leads must be supported to prevent movement during the remainder of the manufacturing process. The leads must be also supported to ensure that all the leads are in the same plane when being mounted to the circuit board. If they are not in the same plane, then some of the leads may not make contact when they are being soldered down.

In the currently preferred embodiment, the leads of the package are supported by a ring support structure. In the currently preferred embodiment, the ring structure is molded or bonded prior to the placement of the die in the package and the molding of the compound (e.g., plastic) around the die. The ring is employed to hold the leads captive during package assembly, test and board assembly. In the currently preferred embodiment, the ring remains on the package, even after attachment of the package to the circuit board. It should be noted that ring support structure 102 does not add thickness to the rest of the package. In the present invention, the thickness of ring support structure 102 should be no thicker than the thickness of molding compound 101 over the die.

In other embodiments, support structure 102 is laminated to leadframe 103 prior to molding. By having support structure 102 attached prior to molding, it serves as a dam bar to prevent molding compound 101 from extruding out between the leads when molding compound 101 is injected.

It should be noted that, in the case of the dam bars of the prior art, each of the leads must be punched-out or singulated to prevent electrical shorting. The punching out of each lead is a fine tuned process, which is capable of leaving little bits of flash or junk (i.e., molding compound where it should not be or where it isn't wanted). In the present invention, each of the leads does not have to be singulated if ring or support structure 102 does not produce a short circuit between leads.

In the present invention, ring support structure 102 comprises a material that provides the desired stiffness for the weight and size of leadframe 103. In the currently preferred embodiment, ring support structure 102 could be constructed out of metal that is insulated from the leads. In other embodiments, ring support structure 102 comprises a rigid fiberglass material.

Ring support structure 102 could be constructed to extend to the edge of molding compound 101. However, if ring support structure 102 and molding compound 101 remain separate, then the stresses corresponding to each are not transferred between the two because the two are only coupled by the copper traces of leadframe 103. In other embodiments, ring support structure 102 extends either all around or underneath the die, such that molding compound 101 and die 104 are resting on top of ring support structure 102.

Whereas many alterations upon applications of the present invention will no doubt become apparent to a person of ordinary skill in the art after having read the foregoing description, it is understood that the particular embodiment shown and described by illustration is in no way intended to be limiting. Therefore, reference to details of the preferred embodiment is not intended to limit the scope of the claims which themselves recite only those features regarded as essential to the invention.

Thus, a very thin, high leadcount integrated circuit package has been described.

I claim:

1. A method for making a high leadcount surface mount integrated circuit package comprising the steps of:

providing a leadframe comprised of a plurality of leads, wherein each of the plurality of leads includes a first end, a second end and an intermediate portion between the first end and the second end;

attaching a permanent support structure to said leadframe, wherein the support structure is attached to the intermediate portion of each of the plurality of leads, such that each of said plurality of leads are held permanently in a predetermined position with respect to the other of said plurality of leads;

attaching the leadframe to an integrated circuit (IC) die, wherein the first end of each of said plurality of leads is coupled to the die in an interconnect area; and molding a plastic compound around the die, wherein the plastic compound is localized over the die, such that the plastic compound covers the interrconnect area and does not extend beyond the die and the interconnect area, such that the plastic compound is spaced apart from the support structure.

2. The method as defined in claim 1 wherein said step of attaching said support structure comprises attaching said support structure, such that said plurality of leads are held in a single plane.

3. The method as defined in claim 1 wherein the step of attaching a support structure comprises attaching a ring to said leadframe.

4. The method as defined in claim 1 wherein the step of attaching a support structure comprises attaching a fiberglass ring to said leadframe.

5. The method defined in claim 1 wherein the plastic compound inclusive of the die has a first thickness, and wherein the step of attaching a support structure includes the step of attaching the support structure having a second thickness, such that the second thickness is less than the first thickness.

6. The method defined in claim 1 wherein the step of attaching the leadframe to the die includes wire bonding the leadframe to the die.

7. The method defined in claim 1 wherein the step of attaching the leadframe to the die includes tape automated bonding the leadframe to the die.

8. The method defined in claim 1 wherein the die has a top, a bottom and four sides, and wherein the plastic compound is molded around the die such that the plastic compound extends a distance of 2 mm or less beyond each of the four sides of the die along the plurality of leads.

9. The method defined in claim 1 wherein the die has a top and four sides, wherein the top has a length, and further wherein the plastic compound is molded around the die such that the plastic compound extends a distance beyond each of the four sides of the die along the plurality of leads, wherein the distance is less than or equal to ten percent of the length.

10. The method defined in claim 1 wherein the support structure is molded to the leadframe.

11. The method defined in claim 1 wherein the support structure is bonded to the leadframe.

12. The method defined in claim 1 wherein the support structure is laminated to the leadframe.

13. A method for making a high leadcount surface mount integrated circuit package comprising the steps of:

providing a leadframe comprised of a plurality of leads, wherein each of the plurality of leads includes a first end, a second end and an intermediate portion between the first end and the second end;

coupling a permanent support structure to said leadframe, wherein the support structure is coupled to the intermediate portion of each of the plurality of leads and holds the plurality of leads in a single plane, such that each of said plurality of leads are held permanently in a predetermined position with respect to the other of said plurality of leads;

attaching the leadframe to an integrated circuit (IC) die, wherein the first end of each of said plurality of leads is coupled the die in an interconnect area; and molding a plastic compound around the die, such that the compound covers the die and is localized over the die and the interconnect area, wherein the plastic compound does not extend beyond the die and the interconnect area and is spaced apart from the support structure, such that a gap along the plurality of leads between the support structure and the plastic compound is created.

14. The method defined in claim 13 wherein the die has a top, a bottom and four sides, and wherein the plastic compound is molded around the die such that the plastic compound extends a distance of 2 mm or less beyond each of the four sides of the die along the plurality of leads.

15. The method defined in claim 13 wherein the die has a top and four sides, wherein the top has a length, and further wherein the plastic compound is molded around the die such that the plastic compound extends a distance beyond each of the four sides of the die along the plurality of leads, wherein the distance is less than or equal to ten percent of the length.

16. The method defined in claim 13 wherein plastic compound inclusive of the die has a first thickness and wherein the step of coupling the permanent support structure includes the step of attaching the permanent support structure having a second thickness less than the first thickness.

17. The method as defined in claim 13 wherein the step of coupling a support structure comprises attaching a ring to said leadframe.

18. The method as defined in claim 13 wherein the step of coupling a support structure comprises attaching a fiberglass ring to said leadframe.

19. The method defined in claim 13 wherein the support structure is molded to the leadframe.

20. The method defined in claim 13 wherein the support structure is bonded to the leadframe.

21. The method defined in claim 13 wherein the support structure is laminated to the leadframe.

22. A method for making a high leadcount surface mount integrated circuit package comprising the steps of:

providing a leadframe comprised of a plurality of leads, wherein each of the plurality of leads includes a first end, a second end and an intermediate portion between the first end and the second end;

coupling a permanent support structure to said leadframe, wherein the support structure is coupled to a part of the intermediate portion of each of the plurality of leads and holds the plurality of leads in a single plane, such that each of said plurality of leads are held permanently in a predetermined position with respect to the other of said plurality of leads, and wherein the support structure extends underneath the die;

attaching the leadframe to an integrated circuit (IC) die, wherein the first end of each of said plurality of leads is coupled the die in an interconnect area; and molding a plastic compound around the die, such that the compound covers the die and is localized over the die and the interconnect area, such that a portion of each of the plurality of leads in a space between the plastic compound and the part of the intermediate portion is exposed.

23. The method defined in claim 22 wherein plastic compound inclusive of the die has a first thickness and wherein the step of coupling the ring structure includes the step of attaching the ring structure having a second thickness less than the first thickness.

* * * * *